(12) United States Patent
Chandramouli et al.

(10) Patent No.: US 11,283,932 B2
(45) Date of Patent: Mar. 22, 2022

(54) PROVIDING VOICE CALL SUPPORT IN A NETWORK

(71) Applicant: NOKIA SOLUTIONS AND NETWORKS OY, Espoo (FI)

(72) Inventors: Devaki Chandramouli, Plano, TX (US); Curt Wong, Bellevue, WA (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 166 days.

(21) Appl. No.: 16/322,155

(22) PCT Filed: Jul. 28, 2017

(86) PCT No.: PCT/US2017/044434
§ 371 (c)(1),
(2) Date: Jan. 31, 2019

(87) PCT Pub. No.: WO2018/026653
PCT Pub. Date: Feb. 8, 2018

(65) Prior Publication Data
US 2019/0174003 A1 Jun. 6, 2019

Related U.S. Application Data

(60) Provisional application No. 62/370,081, filed on Aug. 2, 2016.

(51) Int. Cl.
*H04W 4/00* (2018.01)
*H04M 3/58* (2006.01)
(Continued)

(52) U.S. Cl.
CPC ............ *H04M 3/58* (2013.01); *H01F 7/0278* (2013.01); *H01J 37/3408* (2013.01);
(Continued)

(58) Field of Classification Search
None
See application file for complete search history.

(56) References Cited

U.S. PATENT DOCUMENTS

| 8,781,475 | B1 | 7/2014 | McKeeman et al. | |
|---|---|---|---|---|
| 2002/0132611 | A1* | 9/2002 | Immonen | H04W 28/16 455/414.1 |

(Continued)

FOREIGN PATENT DOCUMENTS

| CN | 102415138 A | 4/2012 |
|---|---|---|
| CN | 103281757 A | 9/2013 |

(Continued)

OTHER PUBLICATIONS

Feb. 24, 2020 Extended Search Report issued in European Patent Application No. 17837442.7.

(Continued)

*Primary Examiner* — Bob A Phunkulh
(74) *Attorney, Agent, or Firm* — Squire Patton Boggs (US) LLP

(57) ABSTRACT

Various communication systems may benefit from improved voice call support. For example, it may be helpful for a user equipment in a first radio access technology that may not support voice calls to initiate a voice call with a second radio access technology. A method includes initiating a voice call between a user equipment to an entity in a second radio access technology cell. The user equipment is located in a first radio access technology cell. The method also includes registering the user equipment with the second radio access technology cell. In addition, the method includes conducting the voice call with the entity via the second radio access technology cell.

20 Claims, 10 Drawing Sheets

(51) Int. Cl.
  *H01J 37/34*    (2006.01)
  *H01F 7/02*     (2006.01)
  *H04W 76/10*    (2018.01)
  *H04L 65/1016*  (2022.01)
  *H04W 48/20*    (2009.01)
  *H04W 60/00*    (2009.01)

(52) U.S. Cl.
  CPC ...... *H01J 37/3461* (2013.01); *H04L 65/1016* (2013.01); *H04W 48/20* (2013.01); *H04W 60/00* (2013.01); *H04W 76/10* (2018.02); *H04M 2207/18* (2013.01)

(56) References Cited

U.S. PATENT DOCUMENTS

| | | | |
|---|---|---|---|
| 2010/0113010 A1* | 5/2010 | Tenny | H04L 47/10 455/423 |
| 2010/0222058 A1* | 9/2010 | Pudney | H04W 36/24 455/435.2 |
| 2011/0305222 A1 | 12/2011 | Kotecha et al. | |
| 2013/0094446 A1* | 4/2013 | Swaminathan | H04W 36/0022 370/328 |
| 2013/0203408 A1* | 8/2013 | Dowds | H04W 8/06 455/432.1 |
| 2013/0260711 A1 | 10/2013 | Shaikh | |
| 2014/0057566 A1* | 2/2014 | Watfa | H04W 48/16 455/41.2 |
| 2014/0087723 A1* | 3/2014 | Cili | H04W 36/0083 455/426.1 |
| 2014/0092721 A1 | 4/2014 | Pankajakshan et al. | |
| 2015/0029978 A1* | 1/2015 | Tranberg | H04W 60/06 370/329 |
| 2015/0099509 A1 | 4/2015 | Mahmood et al. | |
| 2015/0163701 A1 | 6/2015 | Yenamandra et al. | |
| 2016/0021580 A1 | 1/2016 | Mufti | |
| 2017/0070543 A1* | 3/2017 | Balasubramanian | H04W 28/0268 |
| 2017/0105236 A1* | 4/2017 | Chandramouli | H04W 76/10 |
| 2017/0171256 A1* | 6/2017 | Liang | H04W 36/0055 |
| 2017/0188280 A1* | 6/2017 | Watfa | H04W 36/12 |

FOREIGN PATENT DOCUMENTS

| | | |
|---|---|---|
| CN | 104883713 A | 9/2015 |
| EP | 2 315 488 A1 | 4/2011 |
| WO | 2014/117390 A1 | 8/2014 |
| WO | WO 2015/135198 A1 | 9/2015 |
| WO | 2015160329 A1 | 10/2015 |
| WO | 2016022240 A1 | 2/2016 |

OTHER PUBLICATIONS

International Search Report and Written Opinion dated Oct. 20, 2017 corresponding to International Patent Application No. PCT/US2017/044434.

Notification of the First Office Action dated Aug. 26, 2020 corresponding to Chinese Patent Application No. 2017800573471, and English translation thereof.

Qualcomm Inc. et al., "Concurrent RAT operation with NR," R2-164092, 3GPP TSG-RAN2#94, Nanjing, China, May 23-27, 2016.

CMCC, "Considerations on interworking between LTE and new Rat," R3-160807, 3GPP TSG RAN WG3 #91 bis, Bangalore, India, Apr. 11-15, 2016.

Chinese Office Action with English language summary, corresponding to CN Application No. 201780057347.1, dated Jul. 14, 2021.

European Communication pursuant to Article 94(3) EPC, corresponding to EP Application No. 17 837 442.7, dated Jul. 7, 2021.

Chinese Office Action corresponding to CN Application No. 201780057347.1, dated Nov. 11, 2021.

3GPP TS 24.301 V13.4.0 (Dec. 2015), 3rd Generation Partnership Project; Technical Specification Group Core Network and Terminals; Non-Access-Stratum (NAS) protocol for Evolved Packet System (EPS); Stage 3 (Release), 401 pages.

* cited by examiner

PROVIDING VOICE CALL SUPPORT IN A NETWORK

CROSS REFERENCE TO RELATED APPLICATION

This application claims priority to U.S. Provisional Application No. 62/370,081 filed on Aug. 2, 2016. The entire content of the above-referenced provisional application is hereby incorporated by reference.

BACKGROUND

Field

Various communication systems may benefit from improved voice call support. For example, it may be helpful for a user equipment using a first radio access technology that may not support voice calls to initiate a voice call with a second radio access technology that does support voice calls.

Description of the Related Art $5^{th}$ generation (5G) wireless systems are a new generation of radio systems and network architecture that can deliver extreme broadband and ultra-robust, low latency connectivity. 5G allows for massive machine-to-machine (M2M) connectivity for the Internet of Things (IoT). In particular, 5G can improve communication services offered to the end users, and help support massive M2M communications that can connect billions of sensors and machines. For example, industrial control, vehicular safety, transport system efficiency, and eHealth applications may all be improved by the implementation of 5G.

Some of the additional benefits provided by 5G wireless systems include massive broadband that can deliver on demand gigabytes of bandwidth per second in both uplink and downlink transmissions. 5G can also help critical machine-type communications that allow for extremely low latency or immediate synchronous eye-hand feedback. This can facilitate remote control of robots and cars, for example.

Therefore 5G provides for a diverse array of use-cases, and is not limited to a single use-case like other radio access technologies. The architecture of a 5G network can be expanded to multiple dimensions by providing a common core for multiple radio technologies, such as cellular, wireless land access networks, and/or fixed networks. Multiple services, such as IoT, mobile broadband, and latency-high reliability transmissions, and multiple network and service operators can also be provided for by the common core network.

During the early steps of 5G deployment, the 5G coverage area may not be spread as broadly as the coverage areas of other radio access technologies, for example long term evolution (LTE). A device or user equipment operating in a 5G cell may nevertheless want to initiate and maintain a voice call with an entity in a cell of a different radio access technology.

SUMMARY

According to certain embodiments, an apparatus may include at least one memory including computer program code, and at least one processor. The at least one memory and the computer program code may be configured, with the at least one processor, to cause the apparatus at least to initiate a voice call between a user equipment to an entity in a second radio access technology cell. The user equipment may be located in a first radio access technology cell. The at least one memory and the computer program code may also be configured, with the at least one processor, to cause the apparatus at least to register the user equipment with the second radio access technology cell. In addition, the at least one memory and the computer program code may be configured, with the at least one processor, to cause the apparatus at least to conduct the voice call with the entity via the second radio access technology cell.

A method, in certain embodiments, may include initiating a voice call between a user equipment to an entity in a second radio access technology cell. The user equipment may be located in a first radio access technology cell. The method may also include registering the user equipment with the second radio access technology cell. In addition, the method may include conducting the voice call with the entity via the second radio access technology cell.

An apparatus, in certain embodiments, may include means for initiating a voice call between a user equipment to an entity in a second radio access technology cell. The user equipment may be located in a first radio access technology cell. The apparatus may also include means for registering the user equipment with the second radio access technology cell. In addition, the apparatus may include means for conducting the voice call with the entity via the second radio access technology cell.

According to certain embodiments, a non-transitory computer-readable medium encoding instructions that, when executed in hardware, perform a process. The process may include initiating a voice call between a user equipment to an entity in a second radio access technology cell. The user equipment may be located in a first radio access technology cell. The process may also include registering the user equipment with the second radio access technology cell. In addition, the process may include conducting the voice call with the entity via the second radio access technology cell.

According to certain other embodiments, a computer program product may encode instructions for performing a process. The process may include initiating a voice call between a user equipment to an entity in a second radio access technology cell. The user equipment may be located in a first radio access technology cell. The process may also include registering the user equipment with the second radio access technology cell. In addition, the process may include conducting the voice call with the entity via the second radio access technology cell.

According to certain embodiments, an apparatus may include at least one memory including computer program code, and at least one processor. The at least one memory and the computer program code may be configured, with the at least one processor, to cause the apparatus at least to receive a registration request at a network entity in a second radio access technology cell from a user equipment located in a first radio access technology cell. The at least one memory and the computer program code may also be configured, with the at least one processor, to cause the apparatus at least to receive an initiation request for a voice call from the user equipment in the first radio access technology cell. In addition, the at least one memory and the computer program code may be configured, with the at least one processor, to cause the apparatus at least to deliver the voice call to an entity in the second radio access technology cell.

A method, in certain embodiments, may include receiving a registration request at a network entity in a second radio access technology cell from a user equipment located in a first radio access technology cell. The method may also include receiving an initiation request for a voice call from the user equipment in the first radio access technology cell. In addition, the method may include delivering the voice call to an entity in the second radio access technology cell.

An apparatus, in certain embodiments, may include means for receiving a registration request at a network entity in a second radio access technology cell from a user equipment located in a first radio access technology cell. The apparatus may also include means for receiving an initiation request for a voice call from the user equipment in the first radio access technology cell. In addition, the apparatus may include means for delivering the voice call to an entity in the second radio access technology cell.

According to certain embodiments, a non-transitory computer-readable medium encoding instructions that, when executed in hardware, perform a process. The process may include receiving a registration request at a network entity in a second radio access technology cell from a user equipment located in a first radio access technology cell. The process may also include receiving an initiation request for a voice call from the user equipment in the first radio access technology cell. In addition, the process may include delivering the voice call to an entity in the second radio access technology cell.

According to certain other embodiments, a computer program product may encode instructions for performing a process. The process may include receiving a registration request at a network entity in a second radio access technology cell from a user equipment located in a first radio access technology cell. The process may also include receiving an initiation request for a voice call from the user equipment in the first radio access technology cell. In addition, the process may include delivering the voice call to an entity in the second radio access technology cell.

According to certain embodiments, an apparatus may include at least one memory including computer program code, and at least one processor. The at least one memory and the computer program code may be configured, with the at least one processor, to cause the apparatus at least to initiate a registration of a user equipment with a second radio access technology cell. The user equipment may be located in a first radio access technology cell. The at least one memory and the computer program code may also be configured, with the at least one processor, to cause the apparatus at least to receive a voice call at the user equipment from an entity in the second radio access technology cell.

A method, in certain embodiments, may include initiating a registration of a user equipment with a second radio access technology cell. The user equipment may be located in a first radio access technology cell. The method may also include receiving a voice call at the user equipment from an entity in the second radio access technology cell.

An apparatus, in certain embodiments, may include means for initiating a registration of a user equipment with a second radio access technology cell. The user equipment is located in a first radio access technology cell. The apparatus may also include means for receiving a voice call at the user equipment from an entity in the second radio access technology cell.

According to certain embodiments, a non-transitory computer-readable medium encoding instructions that, when executed in hardware, perform a process. The process may include initiating a registration of a user equipment with a second radio access technology cell. The user equipment is located in a first radio access technology cell. The process may also include receiving a voice call at the user equipment from an entity in the second radio access technology cell.

According to certain other embodiments, a computer program product may encode instructions for performing a process. The process may include initiating a registration of a user equipment with a second radio access technology cell. The user equipment is located in a first radio access technology cell. The process may also include receiving a voice call at the user equipment from an entity in the second radio access technology cell.

BRIEF DESCRIPTION OF THE DRAWINGS

For proper understanding of the invention, reference should be made to the accompanying drawings, wherein.

DETAILED DESCRIPTION 5G is a packet based system that may not natively be expected to support voice calls. Certain embodiments therefore provide for a method, an apparatus, or a computer-readable medium that can support voice calls over a 5G network. In certain embodiments, a device or user equipment that is camped in a 5G cell may be able to initiate and receive voice calls, even if the 5G network may not support an internet protocol multimedia subsystem (IMS) network on top. A user equipment being camped in a 5G cell can mean that the user equipment is connected to and/or is located within the coverage area of the 5G cell.

In some embodiments, the user equipment camped in the 5G cell can register with a second radio access technology, and utilize the functionality of the second radio access technology to help facilitate the voice call. The second radio access technology may be, for example, an LTE or a circuit switched (CS) network.

Figure 1:
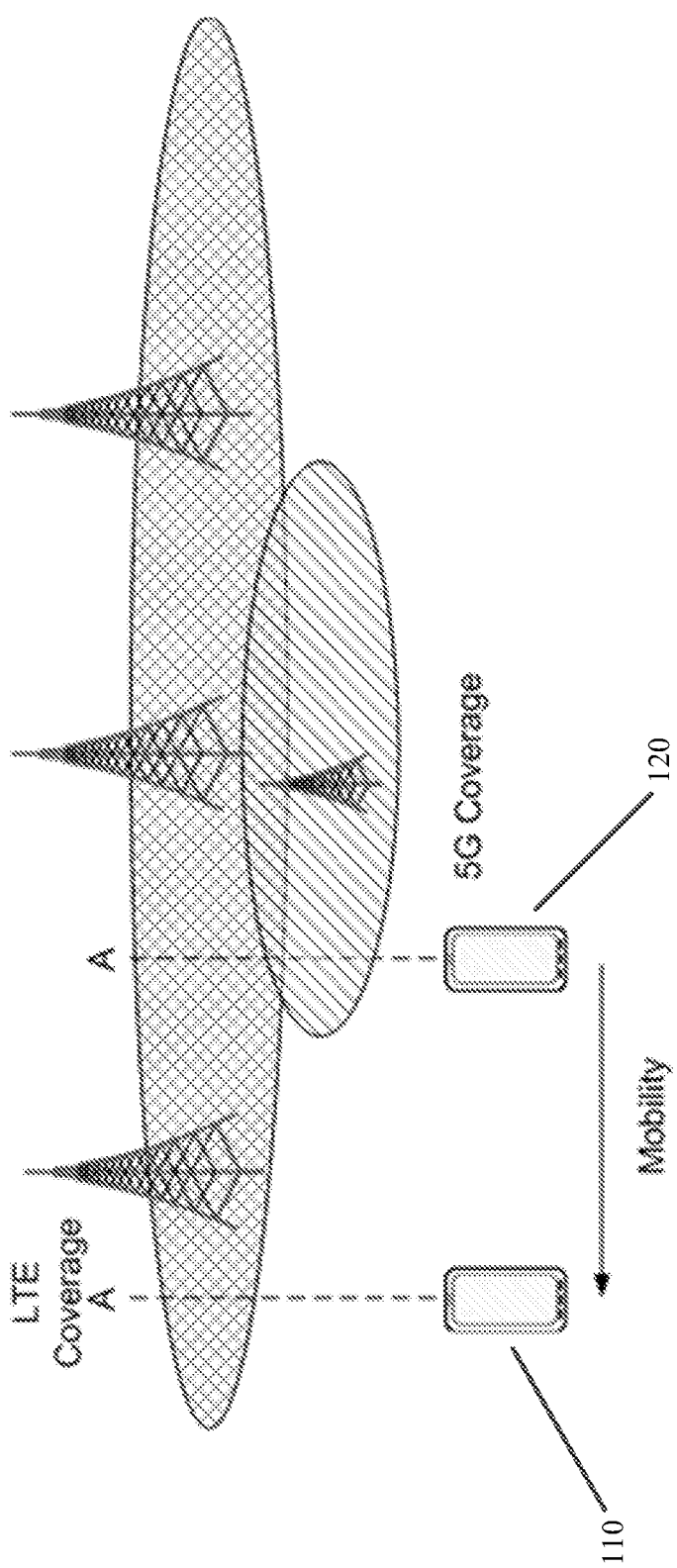
FIG. 1 illustrates a system according to certain embodiments.

FIG. 1 illustrates a system according to certain embodiments. Specifically, FIG. 1 illustrates a first user equipment 110 in a first radio access technology (RAT), for example, LTE coverage cell, and a second user equipment 120 in a second RAT, for example 5G cell. In order for a voice call to occur between first user equipment 110 and second user equipment 120, second user equipment 120 camped in the 5G network must be able to initiate or receive voice calls.

Certain embodiments described below allow for such voice calls between first user equipment 110 and the second user equipment 120.

Figure 2:
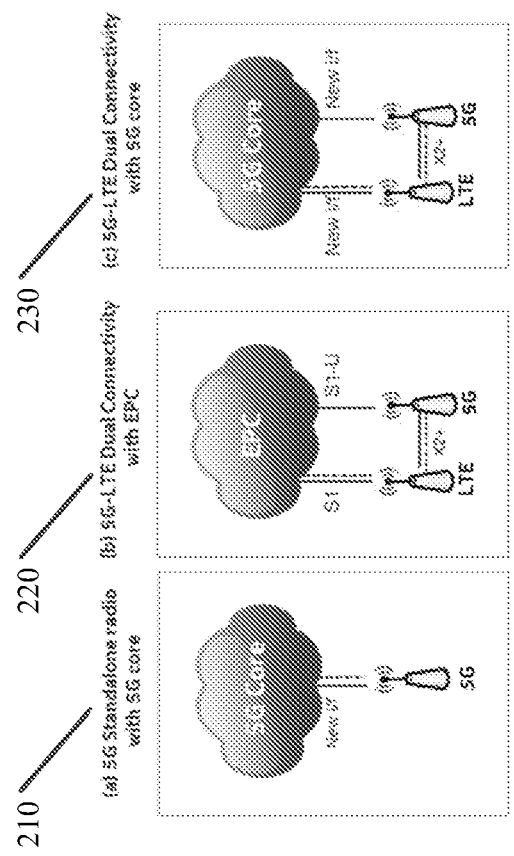
FIG. 2 illustrates a system architecture according to certain embodiments.

FIG. 2 illustrates a system according to certain embodiments. Specifically, FIG. 2 illustrates three different 5G architecture options. Architecture 210 illustrates a 5G standalone radio having a 5G core. Architecture 220, on the other hand, illustrates a 5G-LTE dual connectivity utilizing the evolved packet core (EPC), also referred to as a network core. In other words, the entity in a 5G network and an entity in an LTE network can communication with each other through the EPC, which is a framework for providing voice and data on an LTE network. In certain other embodiments, a 5G-LTE dual connectivity may utilize a 5G core, as shown in architecture 230. According to architecture 230, an entity in a 5G network and an entity in an LTE network can communication through a 5G core.

Certain embodiments may include a 5G system for supporting IMS services. In another embodiment, the 5G system may support fallback to LTE. For example, a 5G system may rely on the LTE architecture in order to help facilitate a voice call. In other words, the fallback may be for a user equipment to move from a packet based system to another packet based system for voice call support. In yet another embodiments, the 5G system can support fallback to any circuit switched (CS) network. Fallback may be defined as a user equipment moving from one cell to another, such as moving from a 5G cell to an LTE cell, in order to utilize the functionality of the another system, for example, a voice call functionality. The fallback, in some embodiment, may be helpful when the cell, in which the user equipment is currently located, does not provide a certain functionality that is needed by the user equipment.

Figure 3:
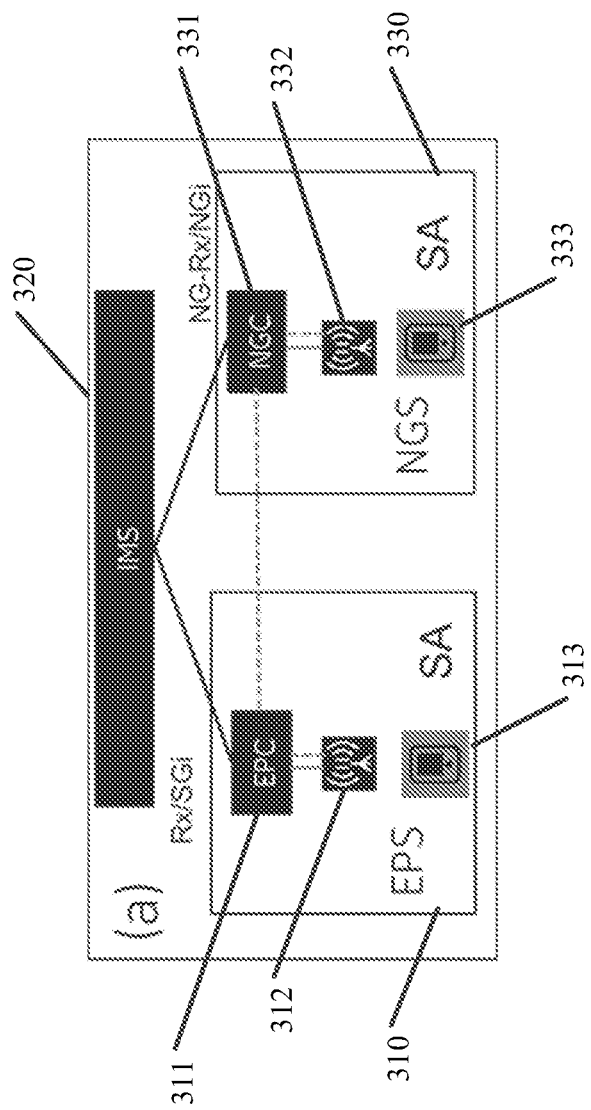
FIG. 3 illustrates a system according to certain embodiments.

FIG. 3 illustrates a system according to certain embodiments. In particular, FIG. 3 illustrates an evolved packet system (EPS) 310, such as LTE, and a next generation system (NGS) 330, such as 5G. EPS 310 can include EPC 311, base station 312, and user equipment 313. Similarly, NGS 330 can include a next generation core (NGC) 331, also referred to as another network core, a base station 332, and a user equipment 333. In certain embodiments, both user equipment 313 in EPS 310 and user equipment 333 in NGS 330 may be registered with IMS 320.

In the embodiments shown in FIG. 3, the user equipment can be connected to a new radio (NR) network and registered with next generation core 331. The user equipment may also, in certain embodiments, have packet data unit (PDU) sessions with NGS 330. From the perspective of EPC 311, user equipment 333 is not registered to the EPC. User equipment 313 and user equipment 333 may therefore communicate through IMS 320. In some embodiments, user equipment 333 may not receive or initiate a voice call with user equipment 313, without first registering with the IMS 320.

Figure 4:
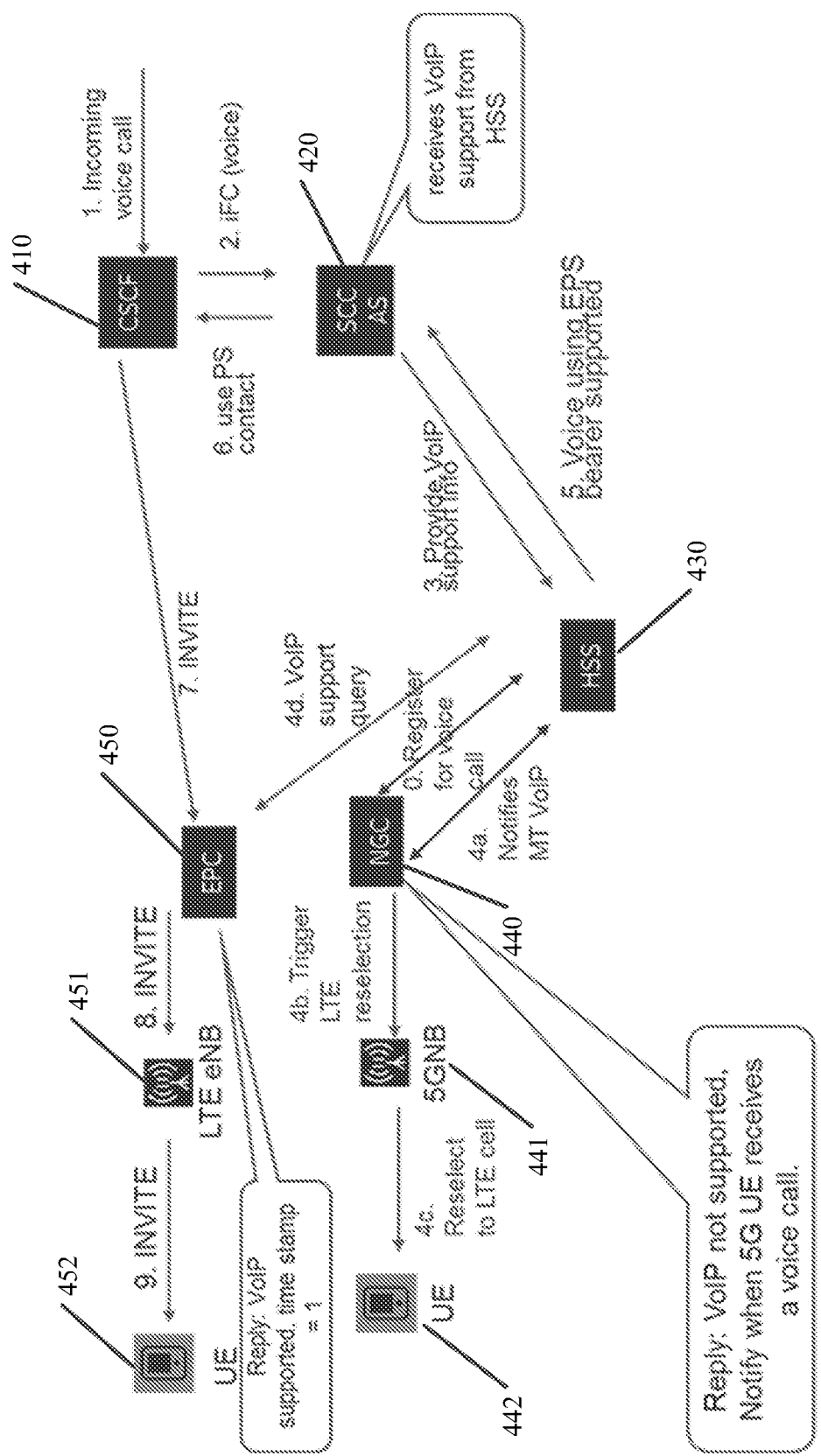
FIG. 4 illustrates a signal flow diagram according to certain embodiments.

In certain embodiments, a voice call with LTE fallback can be initiated or received by user equipment 333, which is registered in NGS 330 with NGC 332. The user equipment can select an LTE cell based on cell selection criteria, for example signal strength and/or radio frequency conditions, on which to fall back. Once the LTE cell is selected, user equipment 333 may register with EPS 310 and IMS 320. Once registered with IMS 320 and EPS 310, the user equipment may be allowed to receive and make voice calls, even when the user equipment is camped in a 5G cell and is registered with a NGS 330. During or after registration, the user equipment 333 may receive an internet protocol (IP) address from EPS 310. The IP address received from EPS 310 may be used by the user equipment to register with the EPS and/or the IMS. In some embodiments, user equipment 333 registers with EPS 310 before it registers with IMS 320. In some embodiments, the user equipment may register with the IMS before it registers with the EPS. For example, as shown in FIG. 4, the user equipment can obtain connectivity via the NGS.

In other embodiment, the user equipment and the network can follow the procedures for mobile originated (MO) calls and mobile terminated (MT) calls as described TS 24.229 and TS 24.301 of Third Generation Partnership Project (3GPP). 3GPP TS 24.229 and 3GPP TS 24.301 are hereby incorporated by reference in their entirety.

The user equipment, in certain embodiments, can send a request to initiate a voice call with an entity, for example another user equipment, in a second radio technology cell, such as an LTE cell. The requesting user equipment may be located in a first radio access cell, for example a 5G cell, which does not support voice calls. The network may receive the voice call, and a network based terminating access domain (T-ADS) can select an EPS for paging and/or delivering the voice call via an LTE radio. The EPS can be chosen, for example, because the IP address that is used for IMS registration belongs to the EPS domain. In certain embodiments, therefore, the user equipment can receive an IP address from the EPC, which is then used to register the user equipment with the IMS. The same IP address can also be used by the T-ADS to select an appropriate EPS, and register the user equipment to the EPS.

As shown in FIG. 3, in certain embodiments, the user equipment can support dual receptions (Rx) and transmissions (Tx). The user equipment can also camp in both the first radio access technology, for example an LTE cell, and the second radio access technology, for example 5G cell, all the time to obtain voice service over LTE and packet data service over 5G.

As described above, certain embodiments include an MT/MO voice call with LTE fallback that is initiated or received by a user equipment registered with NGS 330. For an MO call to work, when the user equipment is in an idle state, the user equipment may send a radio resource control (RRC) establishment request to a radio access network (RAN) with the appropriate cause code when it needs to initiate a voice call. In certain embodiments, base station 332, for example a 5G Node B (5G NB), can instruct or direct the user equipment to reselect an LTE cell for the MO call. In other words, although the user equipment may already be registered with the EPS before it became idle, the user equipment may want to reselect an LTE cell for the MO call.

In embodiments in which the user equipment is in a connected state, on the other hand, for an MO call the user equipment may send a service request to NGC 331 with the appropriate cause code when initiating a voice call. NGC 331 can redirect the user equipment via the existing RAN to reselect an LTE cell for the MO call.

In certain embodiments including a MT call for work, the user equipment can register with NGC 331, obtain an IP address from NGS 330, and register with IMS 320. In certain embodiments, the IP address may not change when the user equipment falls back to EPS 310. This can help ensure session continuity and that the voice call is preserved when a user equipment is handed or moved over from NGS 330 to EPS 310. In some embodiments, in which there is an MT call targeted for the user equipment, a session initiation protocol (SIP) may be delivered to user equipment 333 in NGS 330 via an uplink gateway (UP GW) that also allocated the IP address for the user equipment.

FIG. 4 illustrates a signal flow diagram according to certain embodiments. In particular, FIG. 4 illustrates an MT call in which the user equipment may, in certain embodiments, register in NGC 331, obtain an IP address, and receive data services. NGS may register with a home subscriber network (HSS) 430 to receive MT voice call event notifications. In preparation for receiving EPS voice over IP services, the user equipment may also register in EPS. The user equipment can then obtain an IP address from the EPS, and register with the IMS using the obtained IP address. In some embodiments, the user equipment may trigger the EPS to suspend the EPS bearers until the EPS receives a further indication that the user equipment is performing an LTE fallback to receive a voice call. This suspension of EPS bearers can be helpful in preserving network resources.

An incoming voice call can be received by a call session control function (CSCF) 410. CSCF 410 then forwards the voice call to a service centralization and continuity application server (SCC AS) 420, which receives voice over IP (VoIP) support from HSS 430. HSS 430 can also send a VoIP support query to EPC 450, in order to determine whether EPC 450 supports a VoIP, such as a voice call. Once HSS 440 is provided with VoIP support information from SCC AS 420, it can notify NGC 440 that the user equipment is receiving a voice call, and that it should be redirected to LTE cell. The NGC 440 can then proceed to notify the user equipment to move to an LTE cell. NGC 440 may in certain embodiments send a message to a base station 441, for example a 5G NB, which triggers the user equipment to perform LTE cell selection or reselection. User equipment 442 can then reselect an LTE cell to which the user equipment will move.

In certain embodiments, the IMS network may send a SIP invite to user equipment 452 via the EPS network. For example, HSS 430 can send SCC AS 420 a message including information about whether a voice call is supported by an EPS bearer. SCC AS 420 may then use packet switch (PS) to contact CSCF 410. Before the IMS network delivers the SIP invite via the EPS network, the user equipment in certain embodiments needs to move over to the EPS network or the LTE cell. When the SIP invite is received prior to the user equipment moving over, however, the SIP invite can be reattempted at the IMS layer. Thus, the timing of the movement of the user equipment may be important. As can be seen in FIG. 4, the SIP invite is sent from CSCF 410 to EPC 450, via base station 451, for example LTE eNB, to user equipment 452.

In certain other embodiments, the user equipment may register in the NGC, obtain an IP address, and receive data services. In preparation for receiving services, the user equipment may register in the EPS, and obtain an IP address from EPS. The user equipment may also register with the IMS using both the IP addresses obtained from EPS and NGS. In such an embodiment, the user equipment may have two concurrent IMS registrations. The IP address from NGS may be set at a higher priority so the IMS can try to deliver the voice call to this NGS's IP address first, before the IMS will attempt to use other contact addresses, such as the EPS IP address.

During a MT call, the network may page the user equipment and deliver an invite via the NGC and/or the base station, for example 5G NB, as a first attempt. The user equipment may then indicate to the network that the user equipment can re-select an LTE cell for the MT call. In certain embodiments, the user equipment may send an SIP response code to IMS. The response code may include instructions for the IMS to retry an alternative contact address, such as using the IP address from the EPS.

Yet in other embodiments, the user equipment may register in the NGC, obtain an IP address, and receive data services. NGS may register with HSS for MT data or for an MT voice call event notification. In preparation for receiving services, the user equipment can register in EPS, obtain an IP address, and register with IMS using the IP addresses obtained from EPS. The user equipment may then trigger the EPS to suspend the EPS bearers until further indication that the user equipment is performing LTE fallback to receive voice calls. When the SIP invite targeted for the user equipment is delivered to the EPS network, EPS may notify the NGS that there is a downlink data targeted for the user equipment. NGS notifies the UE, triggers LTE fallback, and the user equipment moves over to the LTE cell.

As discussed above, EPS bearers may be suspended in order to conserve network resources. In certain embodiments, the procedures described in 3GPP TS 23.216 can be used to suspend EPS bearers. 3GPP TS 23.216 is hereby incorporated by reference in its entirety. In certain embodiments, a mobility management entity (MME) may send a suspend notification message towards a serving gateway (S-GW). The S-GW can then release S1-U for the user equipment, and sends a suspend notification message to a packet data network gateway (P-GW). The MME may then store the user equipment context, during part of or during all of the time in which the user equipment is suspended.

As described in FIGS. 3 and 4, the user equipment may be registered in a NGS and camped in a 5G cell. In certain embodiments, the IMS may assist the user equipment in determining when the user equipment reselects an LTE cell, and decides to move to the selected cell, in order to make or receive a voice call. Such embodiments therefore consume less power and resources both from the perspective of the user equipment and the network.

Figure 5:
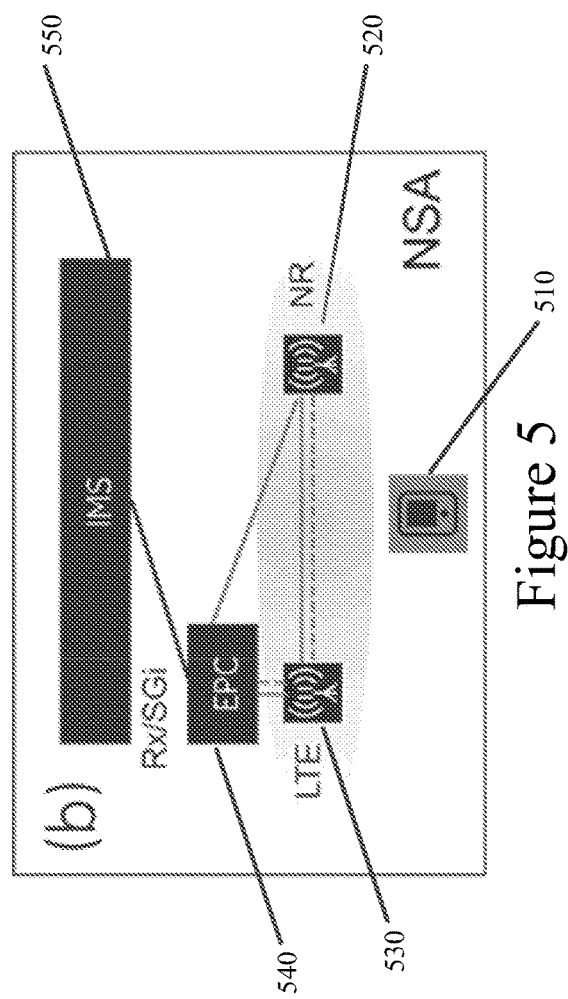
FIG. 5 illustrates a system according to certain embodiments.

FIG. 5 illustrates a system according to certain embodiments. Specifically, FIG. 5 illustrates a 5G network that supports fallback to an LTE network. A user equipment 510 may be connected to new radio base station 520, such as a 5G NB, which can be anchored to an LTE radio or base station 530, also referred to as another base station, and registered with EPC 540. User equipment 510 may have a packet data network (PDN) connection in EPS. From the perspective of the NGC, the user equipment may not be known, and NR base station 520 may not be connected to IMS 550. Rather, EPC 540 is connected to and can be used to send and/or receive information from IMS 550.

In certain embodiments, for an MT or MO voice call, user equipment 510 can be attached to the EPS, and registered with IMS 550. The user equipment has a PDN connection with the EPS, and may receive an IP address from the EPS. The user equipment and the network may also follow TS 24.229 and TS 24.301 procedures. Some embodiments can help ensure that the PDN connection or bearers are established via LTE radio 530, not 1a/3c architecture, for IMS PDN or IMS signaling and media bearers. LTE base stations, such as LTE base station 530, can in certain embodiments use a quality of service class identifier (QCI) of 1/5 as an indication to ensure that the IMS signaling and media bearers are setup over the LTE radio.

Figure 6:
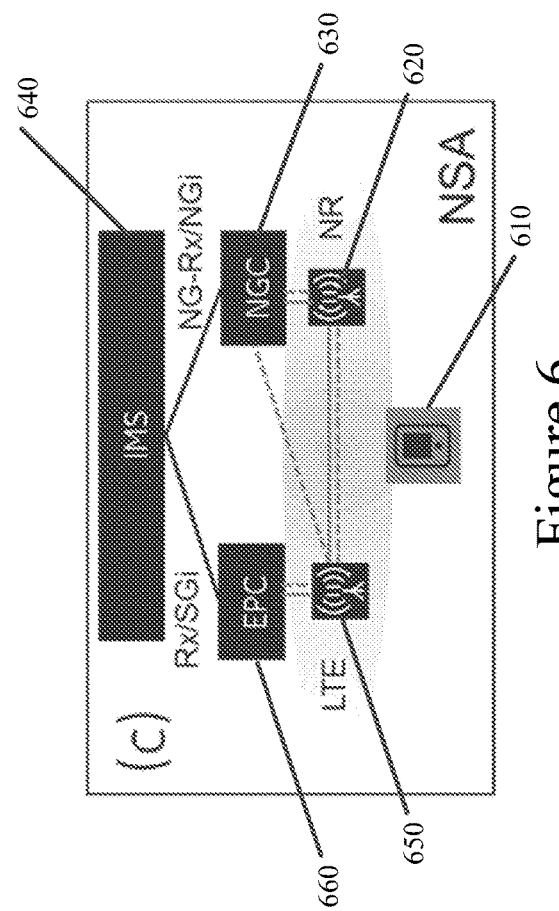
FIG. 6 illustrates a system according to certain embodiments.

FIG. 6 illustrates a system according to certain embodiments. Specifically, FIG. 6 illustrates a 5G network that supports fallback to an LTE network. In contrast to the system illustrated in FIG. 5, FIG. 6 illustrates that both EPC 660 and NGC 630 are registered with IMS 640. In certain embodiments, user equipment 610 can connect to NR base station 620, which may be anchored to an LTE radio or base station 650, and registered with NGC 630. The user equipment may also have protocol data unit (PDU) sessions in NGS, for example, 1a/3c uplink over the RAN. From the EPC perspective, the user equipment remains in an idle state or an idle mode when the user equipment is connected, and registered in the NGS.

For an MO call, when the user equipment is in a connected state or a connected mode in the NGS, the user equipment may request the RAN or the CN to move over to make a voice call. When the user equipment is in an idle mode or an idle state in NGS, the user equipment may instead reselect LTE to initiate voice call, such as triggering a scheduling request. For an MT call, a process similar to that described in relation to FIGS. 3 and 4 may be used.

Figure 7:
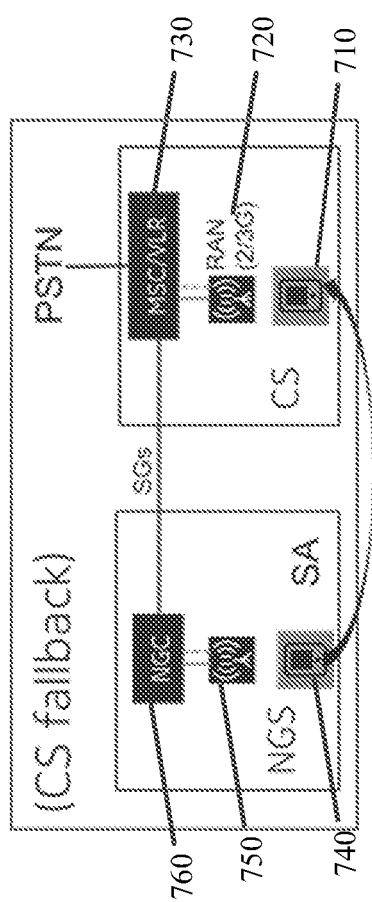
FIG. 7 illustrates a system according to certain embodiments.

FIG. 7 illustrates a system according to certain embodiments. In particular, FIG. 7 illustrates a 5G system that supports fallback to CS. In certain embodiments, the user equipment may connect to NR, anchor to the LTE radio, and register with NGC. The user equipment may also have at least one PDU session in NGS, such as an 1a/3c uplink over the RAN.

In certain embodiments, NGC 760, 5G NB 750, and user equipment 740 may support a similar circuit switched fallback (CSFB) functionality to EPS, as described in the above embodiments shown in FIGS. 5 and 6. Attachment or registration to the IMS may be performed using signaling gateways (SGs) between NGC 760 and mobile switch center (MSC) or visitor location register (VLR) 730 when the user equipment is connected to 5G NB 750. For an MO call to work, a process similar to that described in relation to FIG. 3 may be used. For an MT, MSC or VLR 730 can page user equipment 710 via the SGs defined for CSFB. The NGS network can forward the CS paging to the user equipment, and redirect user equipment 740 to 2G or 3G cell 720. The user equipment 740 may then respond to the CS paging at the 2G or 3G cell.

In certain other embodiments, the user equipment can support dual Rx or Tx. The user equipment may be camped in both CS radio and 5G radio at all times. The user equipment can therefore obtain a voice service over LTE and PS data service over 5G radio. In such an embodiments, the SGs may not be required as an interface between NGC 760 and MSC/VLR 730.

Figure 8:
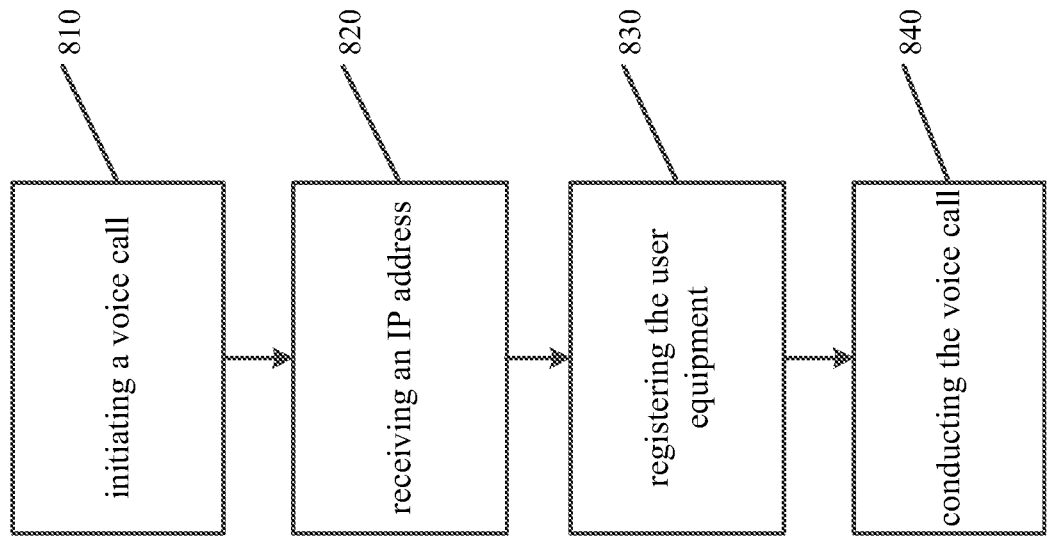
FIG. 8 illustrates a flow diagram according to certain embodiments.

FIG. 8 describes a flow diagram according to certain embodiments. In certain embodiments, the user equipment in a first radio access technology cell, for example a 5G cell, may initiate a voice call to an entity in a second radio access technology cell, for example an LTE, as shown in step 810. The user equipment may then receive an IP address from the second radio access technology cell and/or from the first radio access technology cell, in step 820. This IP address may be used to register the user equipment with the IMS. In step 830, the user equipment can register with the second radio access technology cell via the IP address. Because in some embodiments the first radio access technology may not support a voice call, the user equipment may be moved to the second radio access technology cell, to which it is registered, before conducting a call. In step 840, the user equipment can conduct the voice call with the entity via the second radio access technology cell.

Figure 9:
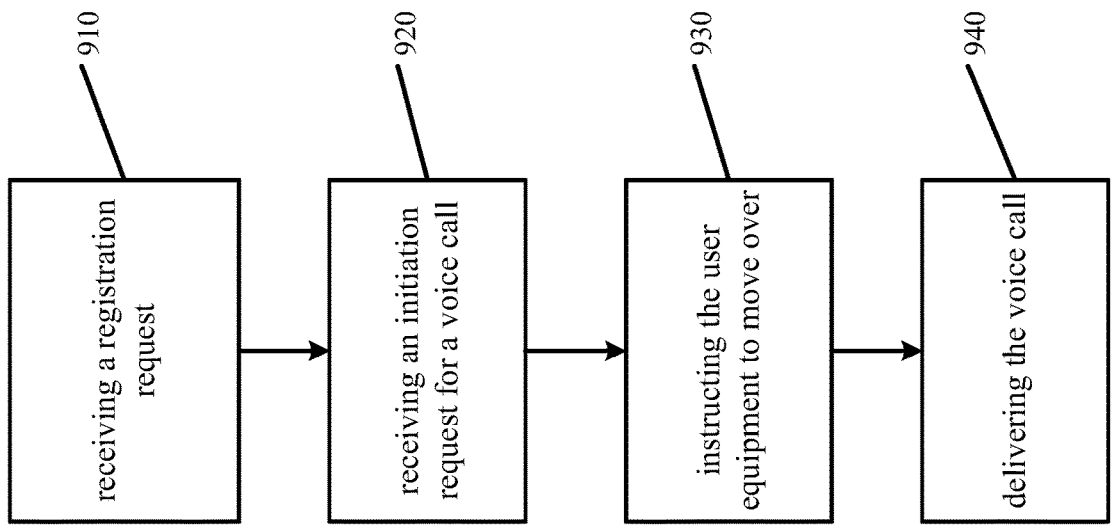
FIG. 9 illustrates a flow diagram according to certain embodiments.

FIG. 9 describes a flow diagram according to certain embodiments. In step 910, a network entity in the second radio access technology cell, for example an LTE cell, may receive a registration request from a user equipment located in a first radio access technology cell, such as a 5G cell. The user equipment may then register with the IMS and/or the second radio access technology cell. The network entity can then receive an initiation request for a voice call from the user equipment in the first radio access technology cell, as shown in step 920. The first radio access technology cell may not support a voice call, in certain embodiments. The network entity, in step 930, may then instruct the user equipment to move over from the first radio access technology cell to the second radio access technology cell. In step 940, the network entity can deliver the voice call to an entity in the second radio access technology cell.

Figure 10:
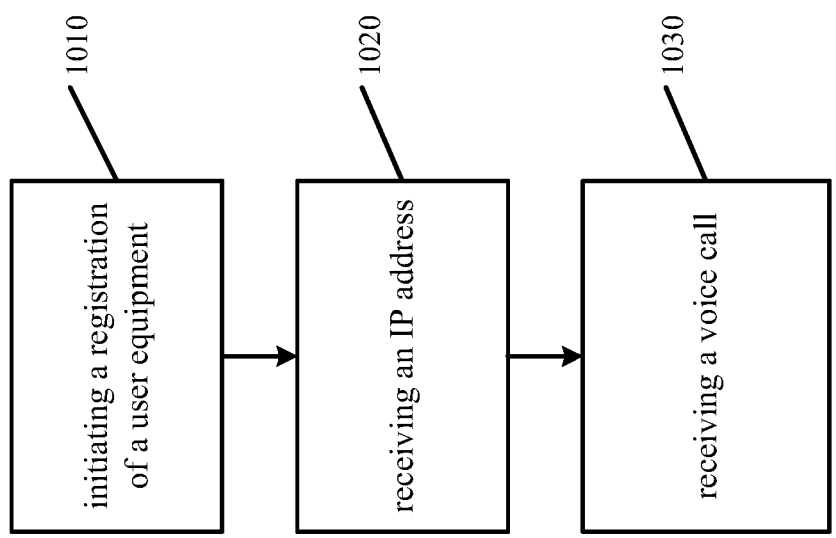
FIG. 10 illustrates a flow diagram according to certain embodiments.

FIG. 10 illustrates a flow diagram according to certain embodiments. In step 1010, the user equipment located in the first radio access technology cell may initiate a registration with a second radio access technology cell. In step 1020, the user equipment may receive an IP address from the first or second radio access technology cell. The user equipment may then register with the IMS. The user equipment may pre-register with second radio access technology in preparation for receiving voice call. In certain embodiments, before receiving a voice call the user equipment may be moved from the first radio access technology cell to the second radio access technology cell. The user equipment may then receive a voice call from an entity in the second radio access technology cell, as shown in step 1030.

Figure 11:
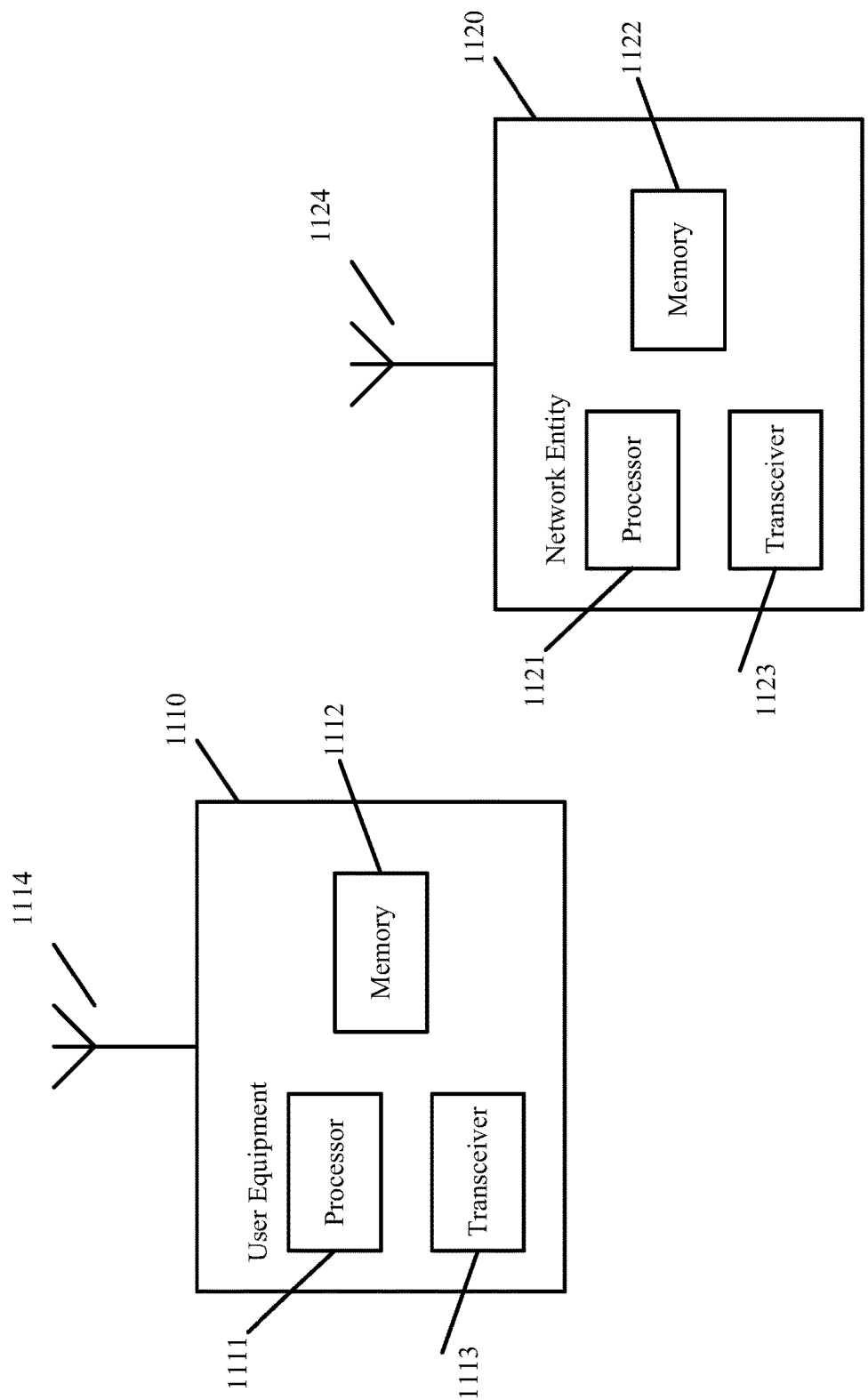
FIG. 11 illustrates a system according to certain embodiments.

FIG. 11 illustrates a system according to certain embodiments. It should be understood that each of FIGS. 1 through 10 may be implemented by various means or their combinations, such as hardware, software, firmware, one or more processors and/or circuitry. In one embodiment, a system may include several devices, such as, for example, network entity 1120 or user equipment 1110. The system may include more than one user equipment 1110 and more one network entity 1120, although only one access node shown for the purposes of illustration. A network entity may be a network node, an access node, a base station, a 5G NB, an evolved NodeB, a radio, a server, a host, or any of the other access or network node discussed herein.

Each of these devices may include at least one processor or control unit or module, respectively indicated as 1111 and 1121. At least one memory may be provided in each device, and indicated as 1112 and 1122, respectively. The memory may include computer program instructions or computer code contained therein. One or more transceiver 1113 and 1123 may be provided, and each device may also include an antenna, respectively illustrated as 1114 and 1124. Although only one antenna each is shown, many antennas and multiple antenna elements may be provided to each of the devices. Other configurations of these devices, for example, may be provided. For example, network entity 1120 and user equipment 1110 may be additionally configured for wired communication, in addition to wireless communication, and in such a case antennas 1114 and 1124 may illustrate any form of communication hardware, without being limited to merely an antenna.

Transceivers 1113 and 1123 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. The operations and functionalities may be performed in different entities, such as nodes, hosts or servers, in a flexible manner. In other words, division of labor may vary case by case. One possible use is to make a network node deliver local content. One or more functionalities may also be implemented as virtual application(s) in software that can run on a server.

A user device or user equipment 1110 may be a mobile station (MS) such as a mobile phone or smart phone or multimedia device, a computer, such as a tablet, provided with wireless communication capabilities, personal data or digital assistant (PDA) provided with wireless communication capabilities, portable media player, digital camera, pocket video camera, navigation unit provided with wireless communication capabilities or any combinations thereof.

In some embodiment, an apparatus, such as a network entity, may include means for carrying out embodiments described above in relation to FIGS. 1 through 10. In certain embodiments, at least one memory including computer program code can be configured to, with the at least one processor, cause the apparatus at least to perform any of the processes described herein.

According to certain embodiments, an apparatus 1110, such as a user equipment, may include at least one memory 1112 including computer program code, and at least one processor 1111. The at least one memory 1112 and the computer program code are configured, with the at least one processor 1111, to cause the apparatus 1110 at least to initiate a voice call between a user equipment to an entity in a second radio access technology cell. The user equipment is located in a first radio access technology cell. The at least one memory 1112 and the computer program code may be configured, with the at least one processor 1111, to also cause the apparatus 1110 at least to register the user equipment with the second radio access technology cell. In addition, the at least one memory 1112 and the computer program code may be configured, with the at least one processor 1111, to cause the apparatus 1110 at least to conduct the voice call with the entity via the second radio access technology cell.

According to certain embodiments, an apparatus 1120, such as a network entity, may include at least one memory 1122 including computer program code, and at least one processor 1121. The at least one memory 1122 and the computer program code are configured, with the at least one processor 1121, to cause the apparatus 1120 at least to receive a registration request at a network entity in a second radio access technology from a user equipment located in a first radio access technology cell. The at least one memory 1122 and the computer program code may be configured, with the at least one processor 1121, to also cause the apparatus 1120 at least to receive an initiation request for a voice call from the user equipment in the first radio access technology cell. In addition, the at least one memory 1122 and the computer program code may be configured, with the at least one processor 1121, to cause the apparatus 1120 at least to deliver the voice call to an entity in the second radio access technology cell.

Processors 1111 and 1121 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors.

For firmware or software, the implementation may include modules or unit of at least one chip set (for example, procedures, functions, and so on). Memories 1112 and 1122 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network entity 1120 or user equipment 1110, to perform any of the processes described above (see, for example, FIGS. 1 through 10). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments may be performed entirely in hardware.

Furthermore, although FIG. 11 illustrates a system including a network entity 1120 and user equipment 1110, certain embodiments may be applicable to other configurations, and configurations involving additional elements, as illustrated and discussed herein. For example, multiple user equipment devices and multiple network entities may be present, or other nodes providing similar functionality, such as nodes that combine the functionality of a user equipment and an network entity, such as a relay node. The user equipment 1110 may likewise be provided with a variety of configurations for communication other than communication network entity 1120. For example, the user equipment 1110 may be configured for device-to-device communication.

The above embodiments provide for improvements to the functioning of a network and/or to the functioning of the nodes or computers within the network. For example, certain embodiments allow for voice calls to be conducted between 5G networks and other radio access technologies, such as LTE. In addition, some embodiments allow the user equipment to be registered in both LTE radio and 5G radio. In other embodiments, however, the user equipment may determine when to reselect an LTE cell in order to make or receive voice calls. In other words, the user equipment may fall back or move from a packet based system to another packet based system for voice call support, or for any other function. Such embodiments can help both the user equipment the network to consume less power and resources.

The features, structures, or characteristics of certain embodiments described throughout this specification may be combined in any suitable manner in one or more embodiments. For example, the usage of the phrases "certain embodiments," "some embodiments," "other embodiments," or other similar language, throughout this specification refers to the fact that a particular feature, structure, or characteristic described in connection with the embodiment may be included in at least one embodiment of the present invention. Thus, appearance of the phrases "in certain embodiments," "in some embodiments," "in other embodiments," or other similar language, throughout this specification does not necessarily refer to the same group of embodiments, and the described features, structures, or characteristics may be combined in any suitable manner in one or more embodiments.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. The communication systems discussed above may be implemented in Third Generation Partnership (3GPP) technology, such as Long Term Evolution (LTE), LTE-advanced (LTE-A), 3rd generation technology (3G), 4th generation technology (4G), 5th generation technology (5G), or any other IP Multimedia System (IMS).

Partial Glossary 5G 5$^{th}$ Generation Wireless Systems
IoT Internet of Things
M2M Machine-to-Machine
LTE Long Term Evolution
IMS Internet Protocol Multimedia Subsystem
RAT Radio Access Technology
EPC Evolved Packet Core
CS Circuit Switch
EPS Evolved Packet System
NGS Next Generation System
NGC Next Generation Core
NR New Radio
PDU Packet Data Unit
MO Mobile Originated
MT Mobile Terminated
3GPP Third Generation Partnership Project
T-ADS Terminating Access Domain
RRC Radio Resource Control
RAN Radio Access Network
SIP Session Initiation Protocol
VoIP Voice Over IP According to a first embodiment, a method may include initiating a voice call between a user equipment to an entity in a second radio access technology cell. The user equipment is located in a first radio access technology cell. The method can also include registering the user equipment with the second radio access technology cell. In addition, the method can include conducting the voice call with the entity via the second radio access technology cell.

In a variant, the first radio access technology may not support voice call.

In another variant, the first radio access technology cell can instruct the user equipment to move over to the second radio access technology cell in order to receive or initiate a voice call.

In yet another variant, the method can further include receiving an internet protocol address from the second radio access technology cell. The internet protocol address can be used to connect the voice call between the user equipment and the entity in the second radio access technology cell.

In a variant, the method can also include receiving an internet protocol address from the first radio access technology cell. The internet protocol address can be used to connect the voice call between the user equipment and the entity in the second radio access technology cell.

In another variant, the first radio access technology can include a fifth generation wireless system, and the second radio access technology can include a long term evolution network.

In yet another variant, the method can include initiating the voice call with the entity in the first radio access technology cell, after attempting to establish the voice call using the second radio access technology cell.

In a variant, the registering of the user equipment includes registering with an evolved packet system and an internet protocol multimedia subsystem.

In another variant, the initiating can include an initiation request that is redirected to the second radio access technology cell based on a state of the user equipment.

In addition, in another variant the initiating of the voice call can include a radio resource control establishment request or a service request.

Another variant the method may also include a packet data network connection or bearers that are established via the second radio access technology for internet protocol multimedia subsystem signaling.

In a variant, the second radio access technology may be a circuit switched network.

In yet another variant, the user equipment may be in an idle state at least before the initiating of the voice call or after the initiating of the voice call.

I another variant, a voice service may be provided over the second radio access technology, and a data service may be provided over the first radio access technology.

According to a second embodiment, a method can include receiving a registration request at a network entity in a second radio access technology cell from a user equipment located in a first radio access technology cell. The method can also include receiving an initiation request for a voice call from the user equipment in the first radio access technology cell. In addition, the method can include delivering the voice call to an entity in the second radio access technology cell.

In a variant, the first radio access technology may not support voice call.

In a variant, the delivering of the voice call can be done after the user equipment is registered with the second radio access technology cell.

In another variant, the method can further include instructing the user equipment to move over from the first radio access technology cell to the second radio access technology cell.

In yet another embodiment, the method can include sending the user equipment an internet protocol address from the second radio access technology.

In another embodiment, the method can include sending the user equipment an internet protocol address from the first radio access technology.

In addition, in a variant the first radio access technology may include a fifth generation wireless system, and the second radio access technology may include a long term evolution network.

In a variant, the method may include registering the user equipment with the second radio access technology and an internet protocol multimedia subsystem. In a variant, the method may include the user equipment registering with an internet protocol multimedia subsystem using the internet protocol address assigned by the second radio access technology.

In a variant, the second radio access technology comprise an evolved packet system.

In another variant, the method may include registering the user equipment with the first radio access technology and an internet protocol multimedia subsystem. In a variant, the method may include the user equipment registering with an internet protocol multimedia subsystem using the internet protocol address assigned by the first radio access technology.

In another variant, the second radio access technology may be a circuit switched network.

In a variant, the first radio access technology may comprise a next generation technology.

According to a third embodiment, a method can include initiating a registration of a user equipment with a second radio access technology cell. The user equipment is located in a first radio access technology cell. The method can also include receiving a voice call at the user equipment from an entity in the second radio access technology cell.

In a variant, the first radio access technology may not support voice call.

In another variant, the method includes receiving an internet protocol address from the second radio access technology cell.

In another variant, the method includes receiving an internet protocol address from the first radio access technology cell.

In yet another variant, the first radio access technology comprises a fifth generation wireless system, and the second radio access technology comprises a long term evolution network.

In a variant, the method may include registering the user equipment with the second radio access technology and an internet protocol multimedia subsystem. In a variant, the method may include the user equipment registering with the internet protocol multimedia subsystem using the internet protocol address assigned by the second radio access technology.

In another variant, the method may include registering the user equipment with the first radio access technology and an internet protocol multimedia subsystem. In a variant, the method may include the user equipment registering with the internet protocol multimedia subsystem using the internet protocol address assigned by the first radio access technology.

In a variant, a home subscriber server can notify the first radio access technology cell of the voice call, and the first radio access technology cell may instruct the user equipment to move over to the second radio access technology cell.

In another embodiment, the move over to the second radio access technology cell may occur before the session initiation protocol is delivered to the user equipment via the second radio access technology cell.

According to a fourth embodiment, an apparatus can include at least one processor and at least one memory and computer program code. The at least one memory and the computer program code can be configured to, with the at least one processor, cause the apparatus at least to perform the method according to the first, second, or third embodiments, and any of their respective variants.

According a fifth embodiment, an apparatus can include means for performing the method according to the first, second, or third embodiments, and any of their respective variant.

According to a sixth embodiment, a computer program product may encode instructions for performing a process including the method according to the first, second, or third embodiments, and any of their respective variants.

According to a seventh embodiment, a non-transitory computer-readable medium may encode instructions that, when executed in hardware, perform a process including the method according to the first, second, or third embodiments, and any of their respective variants.

We claim:

1. A method, comprising:
    initiating a voice call between a user equipment to an entity in a second radio access technology cell, wherein the user equipment is located in a first radio access technology cell;
    registering the user equipment with the second radio access technology cell, wherein the registering of the user equipment includes registering with an evolved packet system and an internet protocol multimedia subsystem based upon a session initiation protocol response code; and
    conducting the voice call with the entity via the second radio access technology cell, and further comprising
    transmitting a service request, wherein the service request comprises a cause code,
    wherein the first radio access technology cell instructs the user equipment to move over to the second radio access technology cell in order to receive or initiate a voice call when the first radio access technology cell does not provide a certain functionality needed by the user equipment.

2. The method according to claim 1, wherein the first radio access technology does not support voice call.

3. The method according to claim 1, further comprising at least one of:
    receiving an internet protocol address from the second radio access technology cell, wherein the internet protocol address is used to connect the voice call between the user equipment and the entity in the second radio access technology cell; or
    receiving another internet protocol address from the first radio access technology cell, wherein the another internet protocol address is used to connect the voice call between the user equipment and the entity in the second radio access technology cell.

4. The method according to claim 3, wherein at least one of the internet protocol address or the another internet protocol address is not changed when moving from the first radio access technology cell and the second radio access technology cell.

5. The method according to claim 1, wherein the first radio access technology comprises a fifth generation wireless system, and wherein the second radio access technology comprise a long term evolution network.

6. The method according to claim 1, further comprising:
    initiating the voice call with the entity in the first radio access technology cell, after attempting to establish the voice call using the second radio access technology cell.

7. The method according to claim 6, wherein the initiating comprises an initiation request that is redirected to the second radio access technology cell based on a state of the user equipment, wherein the state is at least one of an active state of the user equipment or an idle state of the user equipment.

8. The method according to claim 1, wherein a voice service is provided over the second radio access technology, and a data service is provided over the first radio access technology.

9. The method according to claim 1, wherein the user equipment is connected to a base station of the first radio access technology, wherein the base station of the first radio access technology is anchored to another base station of the second radio access technology, and wherein the base station of the second radio access technology is registered with a network core of the first radio access technology or wherein the base station of the second radio access technology is registered with another network core of the second radio access technology.

10. A method, comprising:

receiving a registration request at a network entity in a second radio access technology cell from a user equipment located in a first radio access technology cell;

registering the user equipment with at least one of the second radio access technology cell or the first radio access technology cell and an internet protocol multimedia subsystem based upon a session initiation protocol response code;

receiving an initiation request for a voice call from the user equipment in the first radio access technology cell; and delivering the voice call to an entity in the second radio access technology cell, and further comprising receiving a service request, wherein the service request comprises a cause code, and further comprising instructing the user equipment to move over from the first radio access technology cell to the second radio access technology cell when the first radio access technology cell does not provide a certain functionality needed by the user equipment.

11. The method according to claim 10, wherein the first radio access technology does not support voice call.

12. The method according to claim 10, wherein the delivering of the voice call is performed after the user equipment is registered with the second radio access technology cell.

13. The method according to claim 10, further comprising at least one of:

sending the user equipment an internet protocol address from the second radio access technology; or sending the user equipment another internet protocol address from the first radio access technology.

14. The method according to claim 13, wherein at least one of the internet protocol address or the another internet protocol address is not changed when moving from the first radio access technology cell and the second radio access technology cell.

15. The method according to claim 10, wherein the first radio access technology includes a fifth generation wireless system, and the second radio access technology includes a long term evolution network.

16. The method according to claim 10, wherein the user equipment is connected to a base station of the first radio access technology, wherein the base station of the first radio access technology is anchored to another base station of the second radio access technology, and wherein the base station of the second radio access technology is registered with a network core of the first radio access technology or wherein the base station of the second radio access technology is registered with another network core of the second radio access technology.

17. An apparatus, comprising:

at least one processor; and at least one memory including computer program code, wherein the at least one memory and the computer program code are configured to, with the at least one processor, cause the apparatus at least to perform initiating a voice call between a user equipment to an entity in a second radio access technology cell, wherein the user equipment is located in a first radio access technology cell;

registering the user equipment with the second radio access technology cell, wherein the registering of the user equipment includes registering with an evolved packet system and an internet protocol multimedia subsystem based upon a session initiation protocol response code; and conducting the voice call with the entity via the second radio access technology cell, and to further perform transmitting a service request, wherein the service request comprises a cause code, wherein the first radio access technology cell instructs the user equipment to move over to the second radio access technology cell in order to receive or initiate a voice call when the first radio access technology cell does not provide a certain functionality needed by the user equipment.

18. A computer program product embodied on a non-transitory computer-readable medium encoding instructions that, when executed in hardware, perform a process according to claim 1.

19. A computer program product embodied on a non-transitory computer-readable medium encoding instructions for performing a process according to claim 10.

20. An apparatus, comprising:

at least one processor; and at least one memory including computer program code, wherein the at least one memory and the computer program code are configured to, with the at least one processor, cause the apparatus at least to perform receiving a registration request at a network entity in a second radio access technology cell from a user equipment located in a first radio access technology cell;

registering the user equipment with at least one of the second radio access technology cell or the first radio access technology cell and an internet protocol multimedia subsystem based upon a session initiation protocol response code;

receiving an initiation request for a voice call from the user equipment in the first radio access technology cell; and delivering the voice call to an entity in the second radio access technology cell, and to further perform receiving a service request, wherein the service request comprises a cause code, and to further perform instructing the user equipment to move over from the first radio access technology cell to the second radio access technology cell when the first radio access technology cell does not provide a certain functionality needed by the user equipment.

\* \* \* \* \*